United States Patent [19]
Kiriaki et al.

[11] Patent Number: 6,032,171
[45] Date of Patent: Feb. 29, 2000

[54] FIR FILTER ARCHITECTURE WITH PRECISE TIMING ACQUISITION

[75] Inventors: Sami Kiriaki, Garland, Tex.; Krishnasawamy Nagaraj, Somerville, N.J.; Kerry C. Glover, Wylie, Tex.

[73] Assignee: Texas Instruments Incorporated, Dallas, Tex.

[21] Appl. No.: 08/368,680

[22] Filed: Jan. 4, 1995

[51] Int. Cl.[7] .............................. G06G 7/02; G06F 17/10
[52] U.S. Cl. .......................... 708/819; 708/316; 708/319
[58] Field of Search ................................... 364/825, 602, 364/724.16, 724.13

[56] References Cited

U.S. PATENT DOCUMENTS

| | | | |
|---|---|---|---|
| 4,120,035 | 10/1978 | Cases et al. | 364/602 |
| 4,475,170 | 10/1984 | Haque | 364/825 |
| 4,703,447 | 10/1987 | Lake, Jr. | 364/825 |
| 5,050,119 | 9/1991 | Lish | 364/724.13 |
| 5,185,714 | 2/1993 | Nakayama | 364/736 |
| 5,311,457 | 5/1994 | Shizawa | 364/724.13 |
| 5,381,354 | 1/1995 | Soloff | 364/724.13 |

OTHER PUBLICATIONS

Alan V. Oppenheim, et al., "Digital Signal Processing", pp. 155–163.

Gregory T. Uehara and Paul R. Gray, A 100MHz Output Rate Analog–to–Digital Interface for PRML Magnetic–Disk Re.oad Channels in 1.2um CMOS, ISSCC94/Session 17/Disk–Drive Electronics/. Paper FA 17.3, *1994 IEEE International Solid–State Circuits Conference*, pp. 280–281.

Richard G. Yamasaki, et al., "A 72Mb/S PRML Disk–Drive Channel Chip with an Analog Sampled Data Signal Processor", ISSCC94/Session 17/Disk–Drive Electronics/Paper FA 17.2, *1994 IEEE International Solid–State Circuits Conference*, pp. 278, 279.

Ramon Gomez, et al., "A Discrete–Time Analog Signal Processor for Disk Read Channels", ISSCC 93/Session 13/Hard Disk and Tape Drives/Paper FA 13.1, *1993 ISSCC Slide Supplement*, pp. 162, 163, 279, 280.

Gregory T. Uehara, et al., A 50MHz 70 mW 8–Tap Adaptive Equalizer/Viterbi Sequence Detector in 1.2 um CMOS, *1994 IEEE Custom Integrated Circuits Conference*, pp. 51–54.

*Primary Examiner*—Tan V. Mai
*Attorney, Agent, or Firm*—Mark A. Valetti; Carlton H. Hoel; Richard L. Donaldson

[57] ABSTRACT

A novel Finite Impulse Response ("FIR") filter (10)" is provided with precise timing acquisition. A master/slave sample and hold architecture is employed. In this architecture, an input signal (VIN) is coupled to an input of a master sample and hold circuit (34). A plurality of slave sample and hold circuits (36–44) are coupled to the output of the master sample and hold circuit. The outputs of the slave sample and hold circuits (36–44) are multiplexed to a plurality of multipliers (14–22) in a round robin manner.

20 Claims, 5 Drawing Sheets

FIR FILTER ARCHITECTURE WITH PRECISE TIMING ACQUISITION

CROSS-REFERENCE TO RELATED APPLICATIONS

This application is related to copending U.S. Application Ser. No. 08/368,679, Attorney's Docket No. TI-19520, filed on Jan. 4, 1995 by Sami Kiriaki, et al. and entitled "Low-Power, High-Speed Analog FIR Architecture."

TECHNICAL FIELD OF THE INVENTION

This invention relates generally to signal processing and more particularly, to an improved FIR filter architecture with precise timing acquisition.

BACKGROUND OF THE INVENTION

Digital filters are being used in an increasing number of electronic devices. One commonly used type of digital filter is a finite impulse response (FIR) filter. The finite impulse response filter is a sampled data filter characterized by its impulse response. The input signal is a discrete time sequence which may be analog or digital while the output is also a discrete time sequence which is the convolution of the input sequence and the filter impulse response. The relationship between the input samples $V_i[n]$ and output samples $V_o[n]$ is given by:

$$V_o[n] = A_0 V_i[n] + A_1 V_i[n-1] + A_2 V_i[n-2] + \ldots + A_{N-1} V_i[n-N+1] \quad (1)$$

Applying the Z-transform, the previous relationship can be represented as:

$$V_o(z) = A_0 V_i(z) + A_1 V_i(z) Z^{-1} + A_2 V_i(z) Z^{-2} + \ldots + A_{N-1} V_i(z) Z^{-(N-1)} \quad (2)$$

The components of the coefficient vector $A_0 \ldots A_{N-1}$ are ordinarily referred to as filter tap weights. In the impulse response of the filter, there is no feedback and thus it is an all zero filter, which means that the response is shaped by placement of transmission zeroes in the frequency domain. This class of filters facilitates the implementation of adaptive filter structures.

FIR filters may be implemented in the analog domain or in the digital domain. An analog FIR filter implementation typically performs multiplication of the tap weights and the input signal samples using analog multipliers, and sums each term using an analog summer. In a digital FIR filter implementation, multiplication of the tap weights and the input signal samples as well as summation of each term in equation 1, are typically performed digitally.

Although digital FIR filters normally produce an output signal with a higher signal to noise ratio than an analog FIR filter, digital FIR filters are impractical for some applications. For example, analog FIR filters may normally operate at much higher speeds than digital FIR filters. Analog FIR filters, therefore, are most commonly used in high speed applications such as, for example, magnetic disk drive read channels, radios, modems, and communication channels. However, existing architectures for FIR filters have various drawbacks when used for analog FIR filters.

One existing analog FIR implementation is an analog delay line based architecture. This architecture typically includes an analog delay line, analog multipliers, and an N-input analog summing block. The filter output is the sum of the inner product of the input vector and the coefficient vector. The analog delay line is normally composed of a chain of analog sample and hold amplifiers. Each sample and hold amplifier samples during the holding time of the preceding sample and hold amplifier in the chain. The problem with the delay line based architecture is that in the process of sampling, the signal acquires a certain amount of noise, offset, and distortion. After the analog signal has passed through a chain of sample and hold amplifiers, the level of distortion is often unacceptable.

An analog FIR filter architecture that avoids multiple sampling of the input signal is one employing round robin sampling of the input signal. In this type of architecture, the signal is sampled in a round robin manner, preventing error accumulation from one sample and hold amplifier to the next. Each sample and hold amplifier's output connects to an analog multiplier. In order to simulate delay, the output of the sample and hold amplifier is multiplied in the analog multiplier by a series of tap weights that are shuffled every clock cycle. For example, in a three tap filter, the output of a given sample and hold amplifier will be multiplied by tap weight $A_0$ during the first clock cycle after sampling, by tap weight $A_1$ during the second clock cycle after sampling, and by tap weight $A_3$ on the third clock cycle after sampling.

The problem with this architecture is that the digital tap weights need to be shuffled every clock cycle. A large number of signals, therefore, need to be switched on every clock cycle. For example, in a 9 tap filter using 6-bit digital-to-analog converters, 54 signals are switched during every clock cycle. This heavy switching consumes a large amount of power, especially if the signals are at full CMOS levels. In addition, switching noise can be significant and can affect filter performance. For certain digital-to-analog converter (DAC) circuit implementations where overlapping clocks are required, both true and complement signals are needed. This will double the number of shuffled signals, increasing both power consumption and digital noise generation. Moreover, the shuffling of coefficients every clock cycle poses a great demand on the settling time of the DACs. Lesser settling time is attained at the expense of larger power consumption as faster DAC's consume more power.

The previous two analog FIR filter structures described above are known as direct form FIR filter implementations. An alternative filter implementation is called a transpose-form FIR filter architecture. In a transpose-form FIR filter, the input signal is multiplied by all of the tap coefficients, and delayed versions of the taps are combined together at the output to form the final filter output. Integrators integrate the final filter output over N-clock cycles for an N-tap filter. During each clock cycle, a new multiplying DAC is switched and accumulated in a round robin manner on the integrating capacitor of the integrator block. This FIR filter architecture thus eliminates tap coefficient shuffling at the input of each multiplying DAC.

The problem with this architecture, however, is in the circuit implementation of the integrators and multiplying DACs. In order to achieve high speed and low power consumption, a current-based multiplying DAC is normally used. Then, to perform summation, the current produced by the multiplying DACs is switched onto the capacitor which sums up the charge over N clock cycles. Although such circuit implementation may achieve greater speed, filter performance is greatly diminished due to both clock jitter and integration of switching transients.

The first and second architectures described above employ multiple sample and hold circuits. Ideally, each sample and hold circuit would hold its output at a precise time during a clock transition. Precisely defined sampling instants, however, are difficult to achieve in actual sample and hold circuit implementations. Often, when multiple sample and hold circuits are used in a larger circuit, each sample and hold samples at a slightly different time. In other words, the actual sampling time can occur within a certain neighborhood of a clock edge and the precise sampling time will often vary among multiple sample and holds.

Sample and hold circuit timing errors can lead to several problems. First, the signal to noise ratio of the output of the FIR filter may be disturbed. The equations used to derive an FIR filter assume that an input signal is being sampled at precise instants. When sample and hold circuit timing errors cause the sampling time to deviate from those precisely defined instants, the signal is being sampled at the wrong time and, typically, the signal will have changed value since the precisely defined sampling instant. In effect, the FIR filter receives an incorrect signal value because it samples the signal at an improper time.

In addition, sample and hold timing errors may cause clock jitter as the output of an FIR filter is often fed back into a phase locked loop to generate the clock used to control sampling. Clock jitter on the FIR filter clock further degrades filter performance.

SUMMARY OF THE INVENTION

Accordingly, a need has arisen for a high speed FIR filter architecture with precise timing acquisition. Such an architecture advantageously consumes less power than existing architectures and eases circuit implementation of FIR filters. The present invention achieves these advantages while avoiding the problems of the prior art. In accordance with the present invention, an input signal is coupled to a master input of a "master" sample and hold circuit. A plurality of "slave" sample and hold circuits are coupled to the output of the master sample and hold circuit. The outputs of these circuits may then be used in the taps of an FIR filter by multiplexing the outputs to a plurality of multipliers in a round robin manner.

The present invention has a number of technical advantages. For example, more precise sampling is achieved because all sampling is controlled by a master sample and hold circuit. To achieve higher precision, the master sample and hold circuit can be a fast sample and hold circuit with a precise sampling instant. The master sample and hold circuit may consume a relatively high amount of power to achieve such precision. Unlike existing architectures, however, all sample and hold circuits need not consume a relatively high amount of power and have precise sampling instants. Specifically, the slave sample and hold circuits will normally sample a DC signal—the output of the master sample and hold circuit. The slave sample and hold circuits, consequently, need not be high speed circuits and need not have a precise sampling instant. The precision of the sampling instant is relatively insignificant because the signal does not change in the neighborhood of a clock edge. The signal does not change because the slaves sample the held DC output of the master sample and hold circuit. Likewise, speed is relatively unimportant because the slave circuits sample a DC value and have nearly a full clock cycle to do so.

Another technical advantage of the present invention is that it also reduces noise at the output of the FIR filter because the slave sample and hold circuits are only sampling DC signals. Additionally, the slave sample and hold circuits consume relatively low amounts of power because they are not required to be relatively fast or precise.

BRIEF DESCRIPTION OF THE DRAWINGS

For a more complete understanding of the present invention and the advantages thereof, reference is now made to the following descriptions taken in conjunction with the accompanying drawings in which.

DETAILED DESCRIPTION OF THE INVENTION

The present invention and its advantages are best understood by referring to FIGS. 1–6 of the drawings, like numerals being used for like and corresponding parts of the various drawings.

For the preferred embodiment, the present invention is described in the context of a novel FIR filter set forth in U.S. application Ser. No. 08/368,679, Attorney's Docket No. TI-19520, filed on Jan. 4, 1995 by Sami Kiriaki and William Krenik, entitled "FIR Filter Architecture." In that filter, a fixed tap coefficient signal may be supplied to each of a plurality of multipliers. The outputs of a plurality of sample and hold circuits may then be multiplexed in a round robin manner to at least two of the multipliers. Although the present invention is described in the context of that architecture, the present invention is not limited to use with that architecture and can be used with numerous other FIR filter architectures.

The present invention employs a master/slave sample and hold architecture to achieve the advantages described earlier. An input signal may be coupled to a master input of a master sample and hold circuit. A plurality of slave sample and hold circuits may then be coupled to the output of the master sample and hold circuit. The master sample and hold circuit is preferably a high speed sample and hold circuit having a precise sampling instant. Because the slave sample and hold circuits sample the output of the master sample and hold circuit, the slave sample and hold circuits will sample a DC value. Consequently, the slave sample and hold circuits are not required to be as fast as the master sample and hold circuit, and are not required to have as precise a sampling instant as the master sample and hold circuit. The slave sample and hold circuits, therefore, typically are less complex, consume less layout area in an integrated circuit, and consume less power than the master sample and hold circuit.

Figure 1:
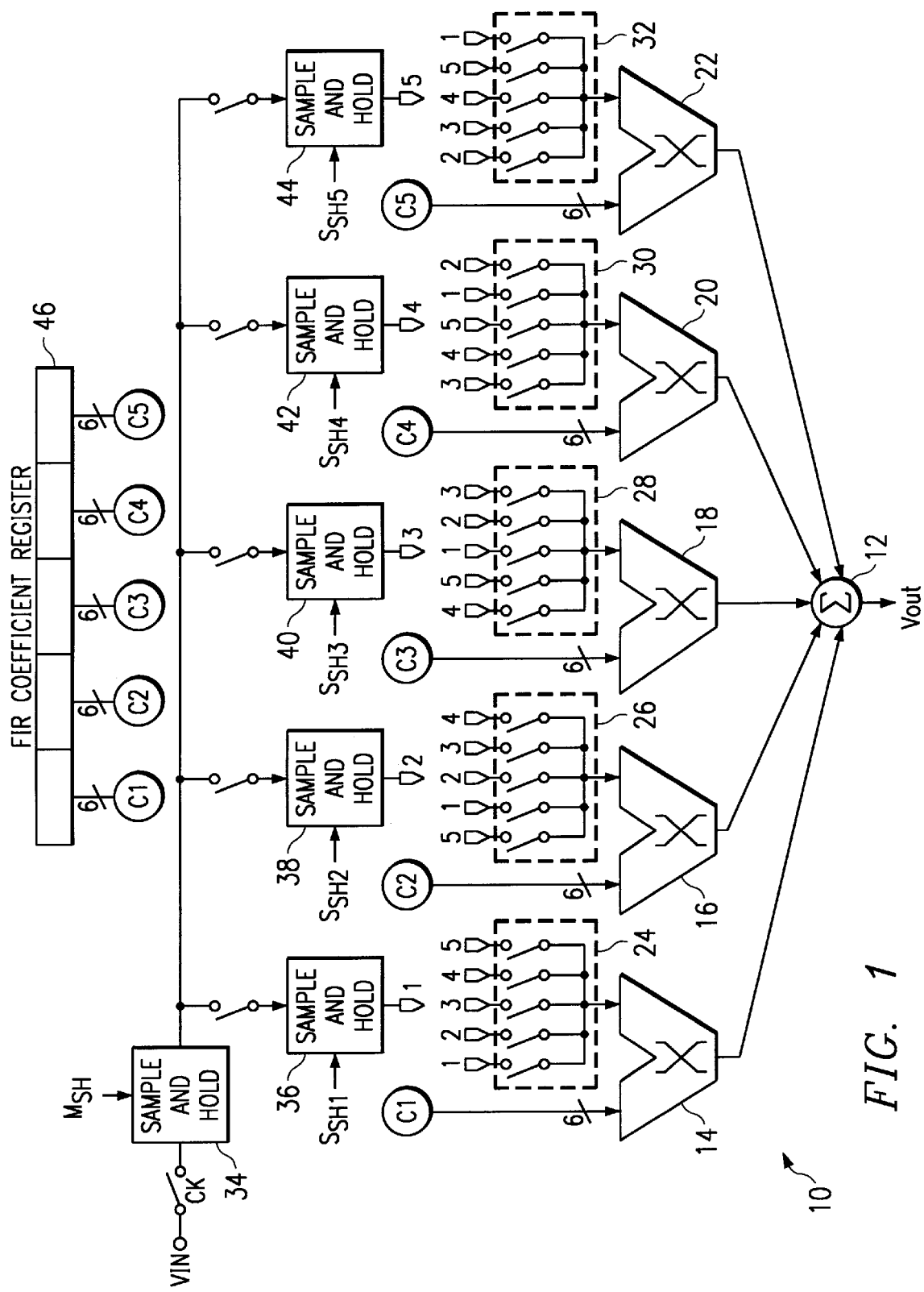
FIG. 1 illustrates one embodiment of an FIR filter constructed in accordance with the teachings of the present invention.

FIG. 1 illustrates a preferred embodiment of an FIR filter 10 constructed in accordance with the teachings of the present invention. FIR filter 10 employs a novel master/slave sample and hold architecture. FIR filter 10 comprises summer 12, multipliers 14–22, multiplexers 24–32, master sample and hold circuit 34, slave sample and hold circuits 36–44 and coefficient register 46. FIR filter 10 is a five tap filter. FIR filter 10, however, could have any number of taps. Similarly, although the number of multiplexers 24–32 and sample and hold circuits 34–42 equals the number of taps in FIR filter 10, more or less multiplexers 24–32 and/or sample and hold circuits 34–44 could be used in a five tap filter with the present invention.

Summer 12 may be, for example, an analog summer that receives five analog inputs and produces an analog output. Alternatively, summer 12 could be an analog summer that receives analog inputs and includes a digital-to-analog converter (DAC) to produce a digital output. Similarly, summer 12 could produce a digital output from a plurality of digital inputs or produce an analog output from a plurality of digital inputs. The output of summer 12, $V_{OUT}$, may represent the output signal produced by FIR filter 10. In this embodiment, each input to summer 12 connects to an output of one of multipliers 14–22. However, the output of summer 12 could also be coupled to another sample and hold circuit to provide stability at the output of FIR filter 10.

Multipliers 14–22 are multiplying DACs. Multipliers 14–22 receive one digital input and one analog input, convert the digital input to an analog value, and produce an analog product of the two inputs. Multipliers 14–22 can also be, for example, any other type of multiplier with any combination of analog or digital inputs and an analog or digital output.

One input of multipliers 14–22 receives a coefficient signal $C_1$–$C_5$. For example, multiplier 14 has an input to receive coefficient $C_1$. In this embodiment, coefficient $C_1$ is a six bit digital value. Coefficient signal $C_1$, however, can have any number of bits or can be an analog signal. Coefficient $C_1$ also can have a different number of bits than coefficient signals $C_2$–$C_5$. Similarly, ones of coefficient signals $C_1$–$C_5$ can be digital signals while others of coefficient signals $C_1$–$C_5$ can be analog signals.

Coefficient signals $C_1$–$C_5$ are supplied by coefficient register 46 in this embodiment. Coefficient register 46 may be a programmable register that receives data values for coefficients $C_1$–$C_5$ from an outside source (not explicitly shown). By using a programmable coefficient register 46, a programmable multi-tap FIR filter integrated circuit may be created. FIR coefficient register 44 may produce, for example, 6-bit digital outputs for coefficient signals $C_1$–$C_5$.

Another alternative to coefficient register 46 is a plurality of coefficient circuits (not explicitly shown). Each coefficient circuit can produce a coefficient signal ($C_1$–$C_5$) at an output to the coefficient circuits, with each coefficient signal representing an FIR coefficient. The outputs of such coefficient circuits can then be coupled to an input of multipliers 14–22. Such coefficient circuits can be either hard-wired or programmable.

Master sample and hold circuit 34 receives an input signal VIN. VIN may be, for example, the input signal filtered by FIR filter 10. Timing for master sample and hold circuit 34 may be controlled by one or more external clock signals $M_{SH}$. As described above, master sample and hold circuit 34 preferably is a high speed sample and hold circuit with a precise sampling instant.

The inputs to sample and hold circuits 36–44 each are coupled to the output of master sample and hold circuit 34. Timing for slave sample and hold circuits 36–44 may be controlled by one or more external clock signals $S_{SH1}$–$S_{SH5}$. Here, the output of each slave sample and hold circuit 36–44 is connected to one input of each of multiplexers 24–32. Alternatively, the outputs of slave sample and hold circuits 36–44 may be connected to less than each of the multiplexers 24–32. In this embodiment, slave sample and hold circuits 36–44 have analog inputs and analog outputs. However, sample and hold circuits 36–44 may have any combination of analog or digital inputs and analog or digital outputs.

Multiplexers 24–32 include a plurality of inputs and an output. Multiplexers 24–32 may be controlled by external control signals (not explicitly shown). The output of each multiplexer 24–32 connects to an input of one of the multipliers 14–22. Here, multiplexers 24–32 have analog inputs and analog outputs, but any combination of analog or digital inputs and analog or digital outputs could be used.

Figure 2:
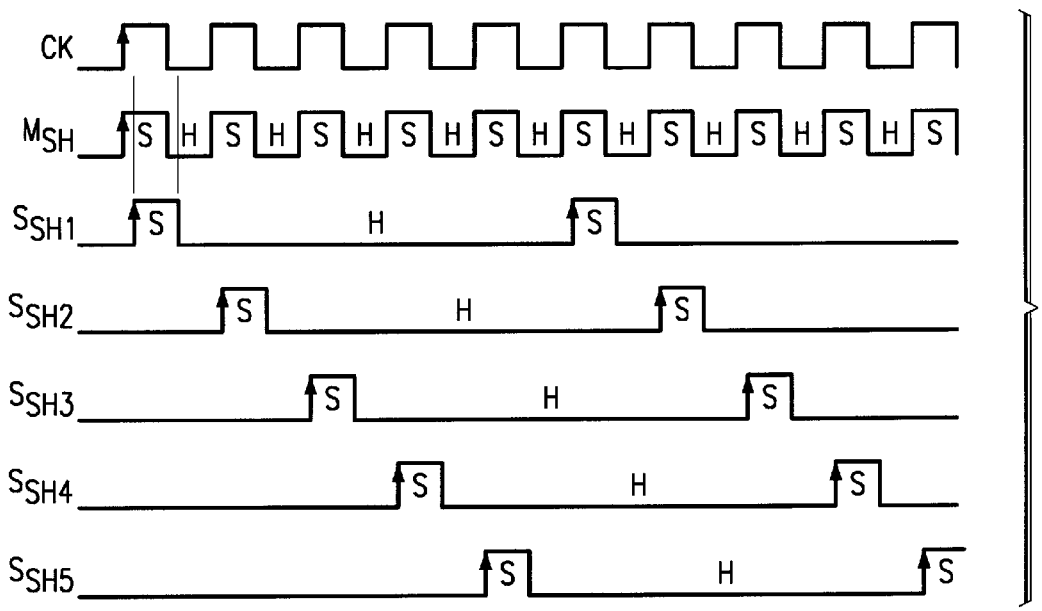
FIG. 2 illustrates timing signals for the FIR filter shown in FIG. 1.

The operation of the embodiment of FIR filter 10 illustrated in FIG. 1 can be described in conjunction with the timing diagram illustrated in FIG. 2. In FIG. 2, signal $C_k$ is an externally generated clock signal. Signal $M_{SH}$ represents a clock signal controlling master sample and hold circuit 34, while $S_{SH1}$–$S_{SH5}$ represent clock signals controlling slave sample and hold circuits 36–44. In the first embodiment of FIR filter 10, master sample and hold circuit 34 and slave sample and hold circuits 36–44 sample while a clock signal high and hold while a clock signal controlling them is low. However, other sampling techniques could also be used in FIR filter 10.

As the timing diagram of FIG. 2 illustrates, master sample and hold circuit 34 may sample the input signal VIN during each clock cycle. In this embodiment, master sample and hold circuit 34 samples the input signal for ½ cycle of clock signal $C_K$ and holds the sampled signal for the other ½ clock cycle of clock signal $C_k$. Each slave sample and hold circuit 36–44 samples the output of master sample and hold circuit 34 for ½ clock cycle and holds the sampled signal for the remaining ½ clock cycle and an additional 4 clock cycles. As illustrated, the sampling period for each slave sample and hold circuits 36–44 may begin a short time after the rising edge of the clock signal, $M_{SH}$, controlling master sample and hold circuit 34.

In this embodiment, slave sample and hold circuits 36–44 sample the output of master sample and hold circuit 34 in a round robin manner. In other words, the slave circuits 36–44 take turns sampling the master circuit 34 output. For example, the first slave sample and hold circuit 36 samples during the positive pulse on $S_{SH1}$ (FIG. 2) while all other slave sample and hold circuits 38–44 are holding. On the next clock cycle of clock $C_K$, slave sample and hold circuit 38 samples in response to the positive pulse on $S_{SH2}$ while all other slave sample and hold circuits 36, 40–44 are holding. This process continues for each slave sample and hold circuit 36–44 and then begins again. On a given clock cycle, one slave sample and hold circuit 36–44 is sampling, while the others are holding. By sampling in such a round robin fashion, the same sample may be used for five clock cycles.

The outputs of slave sample and hold circuits 36–44 are also multiplexed in a round robin manner to multipliers 14–22. For example, during a first clock cycle the output of slave sample and hold circuit 36 is multiplexed to multiplier 14. During the next clock cycle, the same output is multiplexed to multiplier 16. This process continues until a fifth clock cycle, when the output is multiplexed to multiplier 22. At the next clock cycle, the process begins again and the output is once again multiplexed to multiplier 14. Each slave sample and hold circuit 36–44 is multiplexed in a similar manner to multipliers 14–22.

Figure 5:
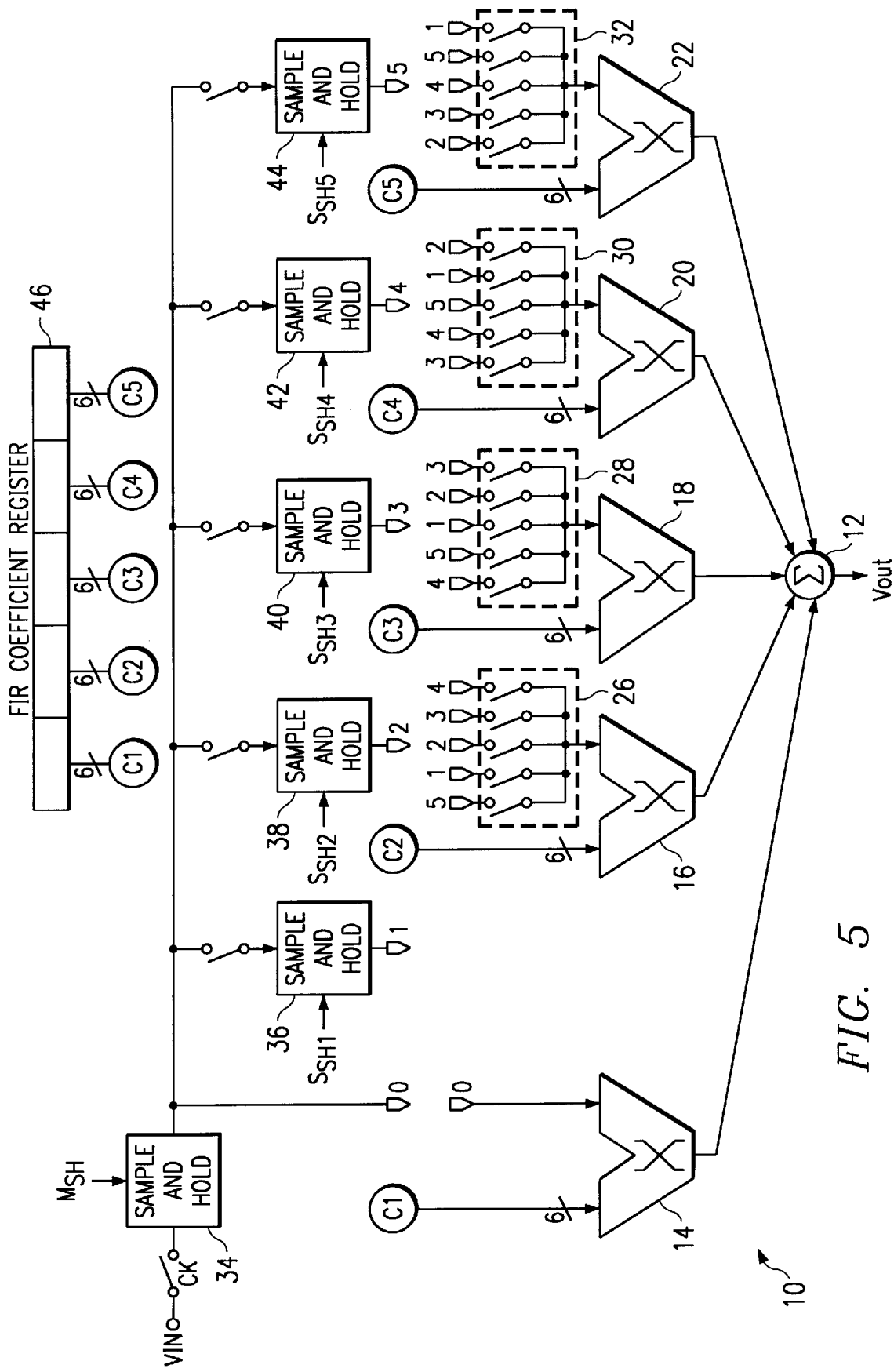
FIG. 5 illustrates a third embodiment of an FIR filter constructed in accordance with the teachings of the present invention.

FIR filter 10 of FIG. 1 may be used for a number of applications. At higher clock rates, however, the holding time of slave sample and hold circuits 36–44 may not be sufficient for the first tap to settle completely. Multiplier 14 has the highest speed requirement for the embodiment in FIG. 1 because the outputs of slave sample and hold circuits 36–44 are always first multiplexed to multiplier 14. This multiplier, consequently, will have less than half of a clock cycle to produce its output. As illustrated in FIG. 2, multiplier 14 produces its output during the time interval between the falling edge of a slave sample and hold clock signal $S_{SH1}$–$S_{SH5}$ and the rising edge of master sample and hold clock signal $M_{SH}$. This time interval will normally comprise less than half of a clock cycle of the master clock signal. The fast settling time required for multiplier 14 may limit the applicability of the architecture illustrated in FIG. 1 for transversal filters filtering high frequency signals. Nevertheless, the embodiments illustrated in FIGS. 3 and 5 are more acceptable for high frequency filters.

Figure 3:
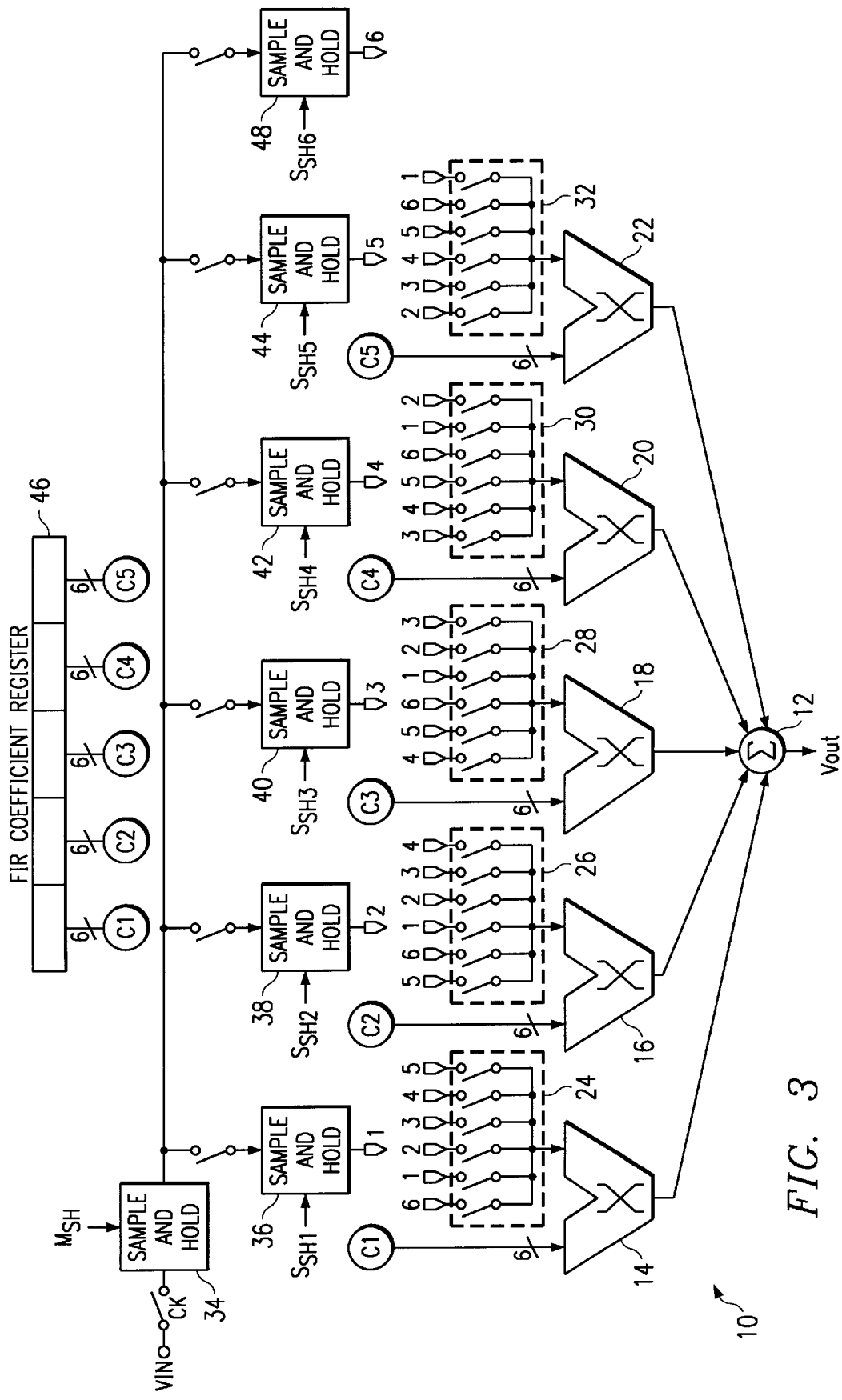
FIG. 3 illustrates a second embodiment of an FIR filter constructed in accordance with the teachings of the present invention.

FIG. 3 illustrates a second embodiment of FIR filter 10. In this embodiment, FIR filter 10 includes an additional slave sample and hold circuit 48 which lessens the speed requirements on multiplier 14. As with the embodiment of FIR filter 10 illustrated in FIG. 1, sample and hold circuits 36–44 and 48 sample the output of master sample and hold circuit 34 in a round robin fashion. The outputs of slave sample and hold circuits 36–44 & 48 are multiplexed to multipliers 14–22 in a round robin fashion. In this embodiment, multiplexers 24–32 have 6 inputs, rather than 5, in order to accommodate the additional slave sample and hold circuit 48.

Figure 4:
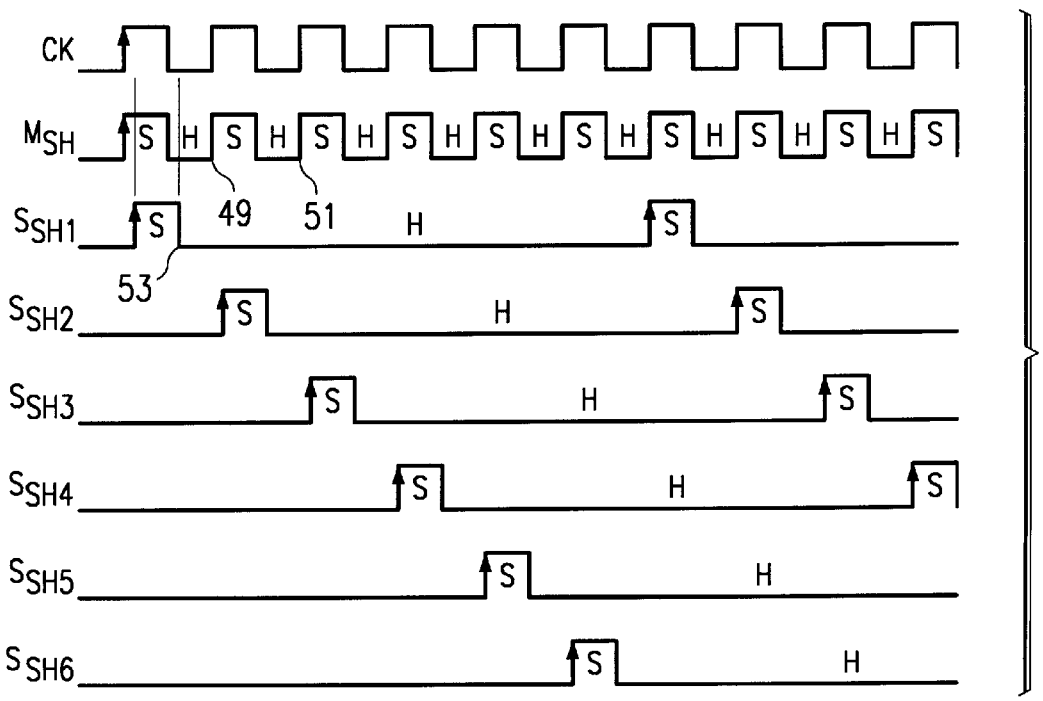
FIG. 4 illustrates timing signals for the FIR filter shown in FIG. 3.

Referring to FIG. 4, the operation of the embodiment of FIR filter 10 illustrated in FIG. 3 is similar to the operation of the embodiment illustrated in FIG. 1. In this embodiment, however, the outputs of slave sample and hold circuits 36–44 & 48 are not multiplexed to one of the multipliers 14–22 until after one full clock cycle of the master sample and hold clock signal $M_{SH}$. In other words, the output of a slave sample and hold circuits 36–44 and 48 in this embodiment is not multiplexed to one of the multipliers 14–22 during the same clock cycle in which it is sampled. Instead, each of the other 5 slave sample and hold circuits are multiplexed to the multipliers 14–22 during that clock cycle.

For example, during the clock cycle in which slave sample and hold circuit 36 samples the output of master sample and hold circuit 34, its output is not multiplexed to any of the multipliers 14–22. Instead, the outputs of slave sample and hold circuits 38–44 and 48 are multiplexed to multipliers 14–22. During the next clock cycle of master sample and hold clock $M_{SH}$, the output of slave sample and hold circuit 38 is not multiplexed to any of multipliers 14–22. During this clock cycle, however, the outputs of slave sample and hold circuits 36, 40–44 and 48 are multiplexed to multipliers 14–22. This process continues for each slave sample and hold circuit 36–44 and 48.

In the embodiment illustrated in FIG. 3, then, the output of a slave sample and hold circuits 36–44 and 48 will not be used until the clock signal that occurs after the sampling period. Multiplier 14, therefore, will have more time to settle than it does in the embodiment illustrated in FIG. 1. In fact, this embodiment may allow over half of a clock cycle of master sample and hold clock $M_{SH}$ for the output of multiplier 14 to settle. Slave sample and hold circuit 36 may be used to illustrate this advantage.

In the embodiment illustrated in FIG. 1, multiplier 14 had to produce its output in the time period between the falling edge of slave sample and hold circuit clock $S_{SH1}$ and the next rising edge of master sample and hold clock $M_{SH}$. In the embodiment illustrated in FIG. 3, however, multiplier 14 has a full clock cycle to produce its output. This full clock cycle may comprise, for example, the clock cycle between the first and second rising edges 49, 51 of master sample and hold clock $M_{SH}$ following a falling edge 53 of slave sample and hold circuit $S_{SH1}$. Therefore, while multiplier 14 can have less than half of a clock cycle to produce a valid output in the embodiment illustrated in FIG. 3, it can have a full clock cycle to produce its output in the embodiment illustrated in FIG. 3. Therefore, the embodiment illustrated in FIG. 3 can be more useful for higher frequency applications.

The embodiment illustrated in FIG. 3 also adds an additional clock cycle of latency when the input signal VIN is first applied to the input of master sample and hold circuit 34. FIR filter 10 in FIG. 1 has a clock latency of 5 clock cycles as it will take 5 clock cycles before each of slave sample and hold circuits 36–44 samples the output of master sample and hold circuit 34. FIR filter 10 of FIG. 3, however, has a clock latency of 6 clock cycles due to the addition of the extra sample and hold circuit. FIR filter 10 illustrated in FIG. 5 has one less clock cycle of latency than the embodiment illustrated in FIG. 3.

FIG. 5 illustrates a third embodiment of an FIR filter 10 constructed in accordance with the teachings of the present invention. In this embodiment, the output of master sample and hold circuit 34 connects directly to multiplier 14, while slave sample and hold circuits 36–44 may be multiplexed to multiplier 16–22 in a round robin fashion. This embodiment has a latency of 5 clock cycles as it employs only 5 slave sample and hold circuits 36–44. Multiplier 14, however, will normally be faster in this embodiment than it would be in the embodiment illustrated in FIG. 3.

Figure 6:
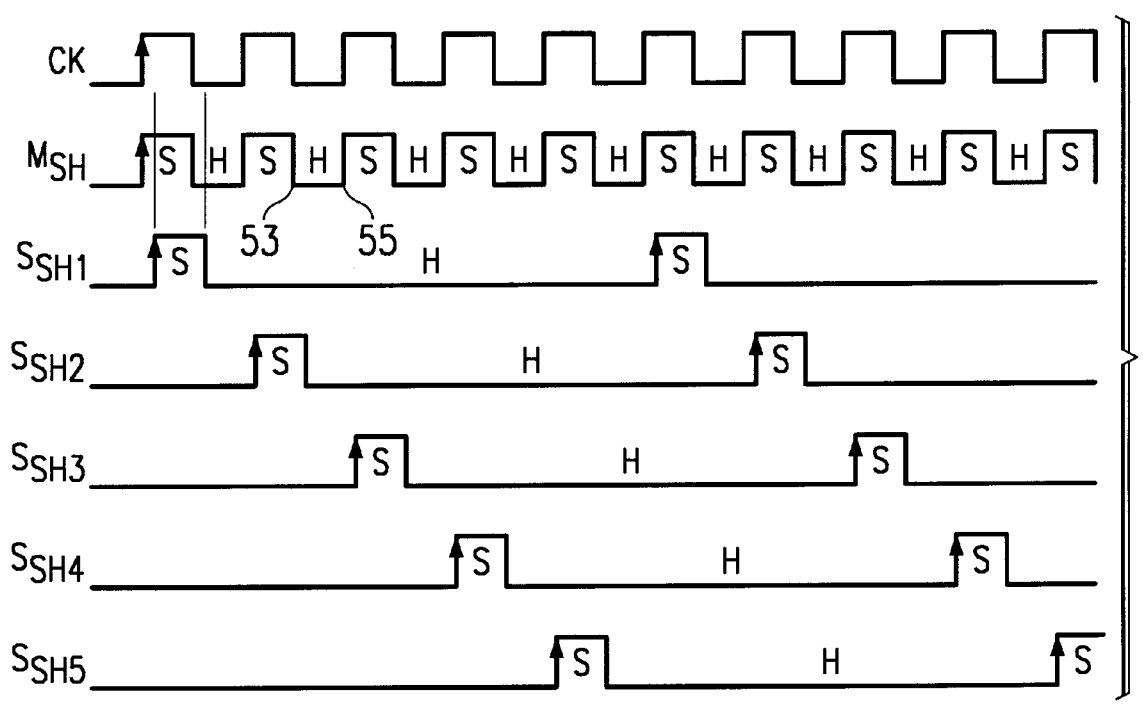
FIG. 6 illustrates timing signals for the FIR filter shown in FIG. 5.

Here, multiplier 14 will normally have half of a cycle of master sample and hold clock $M_{SH}$ to produce its output. Referring to FIG. 6, multiplier 14 will normally need to produce a valid output between a falling edge 53 of master sample and hold clock signal $M_{SH}$ and the next consecutive rising edge 55 of that signal. Multiplier 14 in this embodiment, therefore, will normally be faster than multiplier 14 of the embodiment of FIG. 3, but need not be as fast as multiplier 14 in the embodiment illustrated in FIG. 1.

Although the present invention and its advantages have been described in detail, it should be understood that various changes, substitutions and alterations can be made therein without departing from the spirit and scope of the invention as defined by the appended claims.

What is claimed is:

1. An FIR filter having an output, comprising:
   a plurality of multipliers, each of said multipliers including an output and a first multiplier input and a second multiplier input, each said first multiplier input receiving a coefficient signal representing an FIR coefficient;
   a master sample and hold circuit including a master output and operable to sample a first input signal and hold the value of said first input signal on said master output for a first predetermined period of time;
   a plurality of slave sample and hold circuits, each of said plurality of slave sample and hold circuits comprising a first slave input directly connected to said master output and a first slave output and operable to sample a master signal from said master output and hold the value of said master signal on said first slave output for a second predetermined period of time;
   a plurality of multiplexers, each comprising a plurality of multiplexer inputs and a second output, ones of said second outputs each coupled to one of said second multiplier inputs, at least one of said plurality of multiplexer inputs of a first predetermined number of multiplexers coupled to a first output of a first one of said slave circuits; and
   wherein the output of each of said multipliers is summed so as to form said output of said FIR filter.

2. The FIR filter of claim 1, further comprising:
a coefficient register comprising a plurality of coefficient outputs and operable to store a plurality of data values representing FIR coefficients, said coefficient register further operable to produce a coefficient signal at ones of said coefficient outputs representing an FIR coefficient, and wherein each coefficient output is coupled to one of said first multiplier inputs.

3. The FIR filter of claim 2, wherein said coefficient register is operable to receive said plurality of data values as inputs.

4. The FIR filter of claim 1 wherein each said coefficient signal comprises a digital value.

5. The FIR filter of claim 4 wherein each of said plurality of multipliers further comprises conversion circuitry operable to convert a digital value at said first multiplier input into an analog signal.

6. The FIR filter of claim 1 wherein the number of said plurality of multipliers equals the number of said plurality of multiplexers.

7. The FIR filter of claim 1 wherein each said second output comprises an analog signal; and
wherein each said first slave output comprises an analog signal.

8. The FIR filter of claim 1 wherein the number of said plurality of slave sample and hold circuits equals the number of said plurality of inputs on each of said multiplexers.

9. The FIR filter of claim 1 wherein the number of said plurality of slave sample and hold circuits is one greater than the number of said plurality of multipliers.

10. The FIR filter of claim 9 wherein the number of said plurality of multipliers equals N, the number of said plurality of multiplexers equals N, and the number of said plurality of slave sample and hold circuits equals N+1;
wherein the number of said plurality of multiplexer inputs equals N+1;
wherein each said first slave output is coupled to one of said N+1 multiplexer inputs on each of said N multiplexers; and
wherein each said second output is coupled to one of said second multiplier inputs.

11. The FIR filter of claim 1, wherein the number of said plurality of slave sample and hold circuits equals the number of said plurality of multipliers.

12. The FIR filter of claim 11 wherein the number of said plurality of multipliers equals N, the number of said plurality of multiplexers equals N, and the number of said plurality of slave sample and hold circuits equals N;
wherein the number of said plurality of multiplexer inputs equals N;
wherein each said first slave output is coupled to one of said N multiplexer inputs on each of said N multiplexers; and
wherein each said second output is coupled to one of said second multiplier inputs.

13. The FIR filter of claim 1, wherein said master output couples to one of said second multiplier inputs.

14. The FIR filter of claim 13 wherein the number of said plurality of multipliers equals N, the number of said plurality of multiplexers equals N1, and the number of said plurality of slave sample and hold circuits equals N;
wherein the number of said plurality of multiplexer inputs equals N;
wherein each said first slave output is coupled to one of said N multiplexer inputs on each of said N1 multiplexers; and
wherein each said second output is coupled to one of said second multiplier inputs.

15. A method of making an FIR filter which has an output, comprising the steps of:
supplying a plurality of fixed tap coefficient signals to a plurality of multipliers, one fixed tap coefficient signal per multiplier, each of said multipliers having an output;
coupling an input signal to a master input of a master sample and hold circuit;
directly connecting a master output of said master sample and hold circuit to a plurality of slave sample and hold circuits;
multiplexing a plurality of slave sample and hold circuit output signals in a round robin manner to at least two of said multipliers; and
summing each of said outputs of said multipliers so as to provide said output of said FIR filter.

16. The method of claim 15, wherein said multiplexing step further comprises the step of multiplexing said output signals in a round robin manner to each of said plurality of multipliers.

17. The method of claim 15, further comprising the step of:
connecting said master output to one of said multipliers.

18. The method of claim 15, wherein the number of said plurality of slave sample and hold circuits equals the number of said plurality of multipliers.

19. The method of claim 15, wherein said fixed tap coefficient signals comprise digital signals.

20. The method of claim 15, wherein the number of said plurality of slave sample and hold circuits is greater than the number of said plurality of multipliers.

* * * * *